United States Patent [19]
Ionov et al.

[11] Patent Number: 6,013,582
[45] Date of Patent: Jan. 11, 2000

[54] METHOD FOR ETCHING SILICON OXYNITRIDE AND INORGANIC ANTIREFLECTION COATINGS

[75] Inventors: Pavel Ionov, Sunnyvale; Sung Ho Kim, Campbell, both of Calif.; Dean Li, Taipei, Taiwan

[73] Assignee: Applied Materials, Inc., Santa Clara, Calif.

[21] Appl. No.: 08/986,911

[22] Filed: Dec. 8, 1997

[51] Int. Cl.$^7$ .................................................. H01L 21/44
[52] U.S. Cl. .................... 438/738; 438/710; 438/717; 438/718; 438/723; 438/724; 438/743; 438/744; 216/37; 216/41; 216/47; 216/67; 216/72; 216/74
[58] Field of Search ..................... 438/695, 696, 438/700, 710, 717, 718, 723, 724, 738, 743, 744; 216/37, 41, 47, 67, 72, 74

[56] References Cited

U.S. PATENT DOCUMENTS

| | | | |
|---|---|---|---|
| 4,758,305 | 7/1988 | Bonifield | 156/643 |
| 5,034,348 | 7/1991 | Hartswick et al. | 437/200 |
| 5,186,718 | 2/1993 | Tepman et al. | 29/25.01 |
| 5,269,879 | 12/1993 | Rhoades et al. | 156/643 |
| 5,310,626 | 5/1994 | Fernades et al. | 430/327 |
| 5,350,488 | 9/1994 | Webb | 156/643 |
| 5,441,914 | 8/1995 | Taft et al. | 437/189 |
| 5,468,656 | 11/1995 | Shieh et al. | 437/23 |
| 5,472,829 | 12/1995 | Ogawa | 430/325 |
| 5,482,817 | 1/1996 | Dichiara et al. | 430/271.1 |
| 5,514,247 | 5/1996 | Shan et al. | 156/643.1 |
| 5,525,542 | 6/1996 | Maniar et al. | 437/186 |
| 5,539,249 | 7/1996 | Roman et al. | 257/649 |
| 5,633,210 | 5/1997 | Yang et al. | 438/669 |

(List continued on next page.)

FOREIGN PATENT DOCUMENTS

| | | | |
|---|---|---|---|
| 0470707 | 2/1992 | European Pat. Off. | H01L 21/027 |
| 0644582 | 3/1995 | European Pat. Off. | H01L 21/28 |

OTHER PUBLICATIONS

Y. Ye et al., "0.35–Micron and Sub–0.35–Micron Metal Stack Etch in a DPS Chamber—DPS Chamber and Process Characterization", Electrochemical Society Proceedings, vol. 96–12, pp. 223–233, 1996.

S. Arai et al., "Deposition in Dry–Etching Gas Plasmas", Jap. J. Appl. Phys., Part 1, vol. 31, pp. 2011–2019 (1992).

Wei W. Lee et al., "Fabrication of 0.06 μm Poly–Si Gate Using DUV Lithography With a Designed $Si_xO_yN_x$ Film as an ARC and Hardmask", 1997 Symposium on VLSI Technology Digest of Technical papers, pp. 131–132.

International Search Report dated Mar. 29, 1999, in PCT Application No. PCT/US98/25817, filed Dec. 4, 1998.

Primary Examiner—Bruce Breneman
Assistant Examiner—Allan Olsen
Attorney, Agent, or Firm—Shirley Church

[57] ABSTRACT

The present disclosure pertains to a method for plasma etching a semiconductor patterning stack. The patterning stack includes at least one layer comprising either a dielectric-comprising antireflective material or an oxygen-comprising material. In many instances the dielectric-comprising antireflective material will be an oxygen-comprising material, but it need not be limited to such materials. In one preferred embodiment of the method, the chemistry enables the plasma etching of both a layer of the dielectric-comprising antireflective material or oxygen-comprising material and an adjacent or underlying layer of material. In another preferred embodiment of the method, the layer of dielectric-comprising antireflective material or oxygen-comprising material is etched using one chemistry, while the adjacent or underlying layer is etched using another chemistry, but in the same process chamber. Of particular interest is silicon oxynitride, an oxygen-comprising material which functions as an antireflective material. A preferred embodiment of the method provides for the use of a source of carbon and an appropriate halogen-comprising plasma, to achieve selective etch of one oxygen-containing material compared with another material which contains a more limited amount of oxygen.

29 Claims, 4 Drawing Sheets

U.S. PATENT DOCUMENTS

| | | | |
|---|---|---|---|
| 5,635,338 | 6/1997 | Joshi et al. | 430/325 |
| 5,639,687 | 6/1997 | Roman et al. | 437/186 |
| 5,710,067 | 1/1998 | Foote et al. | 437/238 |
| 5,710,073 | 1/1998 | Jeng et al. | 438/239 |
| 5,733,712 | 3/1998 | Tanaka et al. | 430/314 |
| 5,767,018 | 6/1998 | Bell | 438/696 |

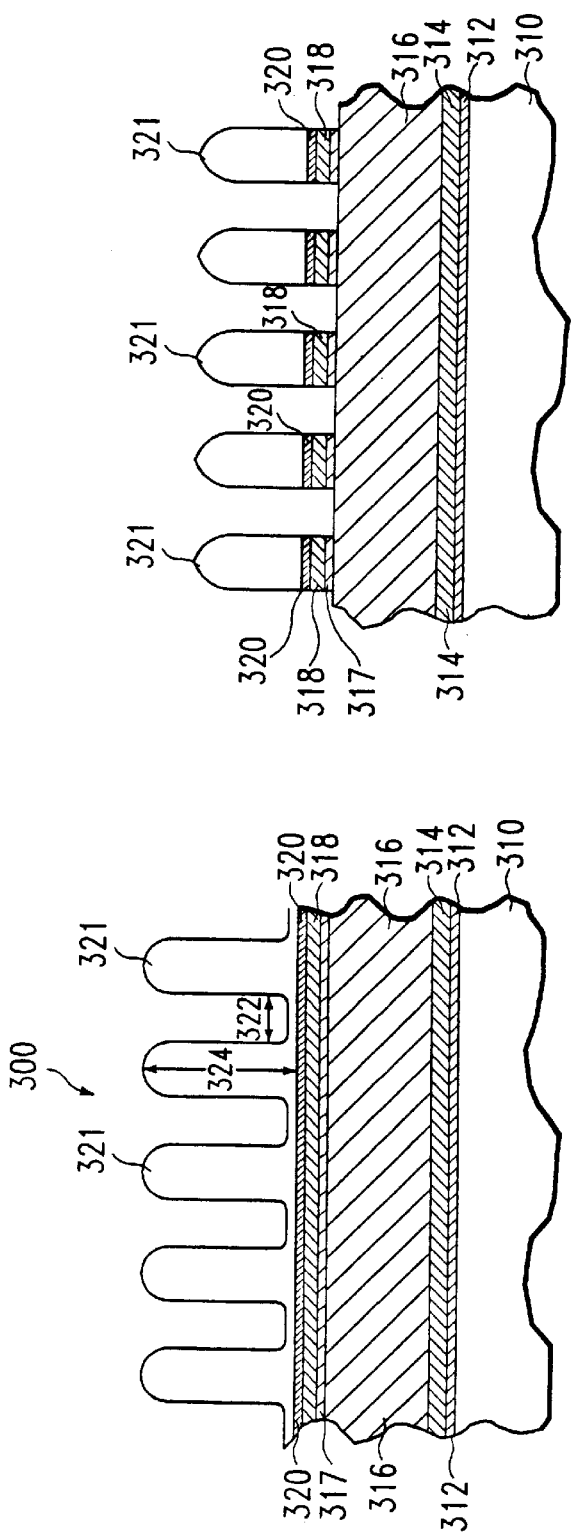
FIG. 3A
FIG. 3B
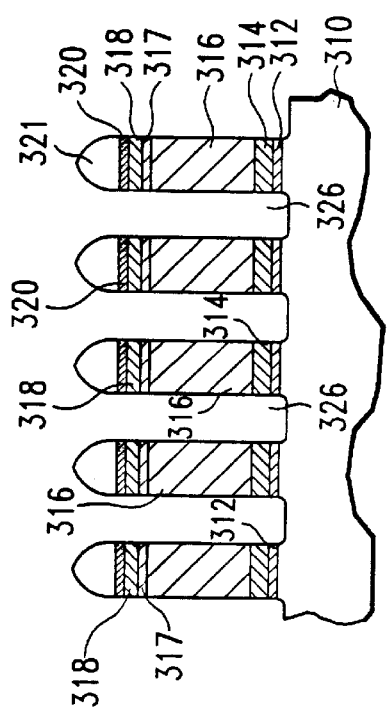
FIG. 3C

METHOD FOR ETCHING SILICON OXYNITRIDE AND INORGANIC ANTIREFLECTION COATINGS

BACKGROUND OF THE INVENTION

1. Field of the Invention

The present invention pertains to a method of etching silicon oxynitride and other oxygen containing materials. In addition, the method is applicable to inorganic antireflective coating (ARC) materials. Silicon oxynitride is commonly used as an antireflective coating in combination with deep ultraviolet (DUV) photoresists.

2. Brief Description of the Background Art

In the field of semiconductor device fabrication, DUV photoresists have been developed which take advantage of shorter wavelengths of ultraviolet radiation to enable the patterning of smaller-dimensioned electronic and optical devices than possible with traditional, or so called I-line photoresists.. Generally, the photoresist is applied over a stack of layers of various materials to be patterned in subsequent processing steps. Some of the layers in the stack are consumed during the process of patterning underlying layers which become part of the functioning device. To take advantage of the spacial resolution of the photoresist, it is necessary to use an anti- reflective coating (ARC) layer underlying the photoresist, to suppress reflection off other layers in the stack during photoresist exposure. Thus, the ARC layer enables patterning of the photoresist to provide an accurate pattern replication.

Though the most commonly used ARC material is titanium nitride, a number of other materials have been suggested for use in combination with DUV photoresists. For example, U.S. Pat. No. 5,441,914 issued Aug. 15, 1995 to Taft et al. describes the use of a silicon nitride anti-reflective layer, while U.S. Pat. No. 5,525,542, issued Jun. 11, 1996 to Maniar et al. discloses the use of an aluminum nitride anti-reflective layer. U.S. Pat. No. 5,539,249 of Roman et al., issued Jul. 23, 1996, describes the use of an antireflective layer of silicon-rich silicon nitride. U.S. Pat. No. 5,635,338 to Joshi et al., issued Jun. 3, 1997, describes a class of silicon-containing materials which display particular sensitivity in the untraviolet and deep ultraviolet for the formation of patterns by radiation induced conversion into glassy compounds. Joshi et al. recommend the use of anti-reflective coatings such as amorphous silicon and an organic plasma polymerized anti-reflective coating generated from cycloheptatriene. U.S. Pat. No. 5,633,210 to Yang et al., issued May 27, 1997 discloses the use of an anti-reflective coating material selected from titanium nitride materials, silicon oxide materials, and silicon oxynitride materials.

Recently there has been increased interest in the use of silicon oxynitride as an anti-reflective coating, due to its ability to function well in combination with DUV photoresist. Silicon oxynitride typically (but not by way of limitation) has a formula of $SiO_xN_yH_z$, where x ranges from 0 to about 2, y ranges from 0 to about 1, and z ranges from 0 to about 1. By changing the composition of the silicon oxynitride ARC layer, one can control reflection onto the photoresist during imaging of the photoresist layer. When $SiO_xN_yH_z$ is used as an ARC, x, y, and z typically range between about 0.2 and about 0.5.

Silicon oxynitride as an ARC enables efficient suppression of the reflection from underlying layers while providing superior chemical properties which prevent an undesirable effect in photoresist patterning known as photoresist poisoning. Photoresist poisoning refers to reaction of the surface underlying the photoresist with moisture to form amino basic groups ($NH_2^-$) which react with the photogenerated acid which is responsible for the photoresist development. Deactivation of the acid by the amino groups is believed to be responsible for formation of the "foot" (widening of the photoresist line just above the substrate) on some ARC materials such as titanium nitride.

The present invention addresses details of the application of dry etch techniques for pattern transfer into a silicon oxynitride layer. However, the concepts developed for dry etch of a silicon oxynitride layer have application to the dry etch of other oxygen containing substrates.

With reference to a silicon oxynitride layer used as an anti-reflective coating, in such an application, a typical stack of materials for pattern transfer would include: A substrate, which is a dielectric layer used to separate a metal interconnect layer (to be patterned on plasma etching of the etch stack) from underlying device layers. A barrier layer, which prevents the diffusion of material between a conductive layer and the substrate. A conductive layer, which is typically aluminum or an alloy thereof. An anti-reflective-coating (ARC) layer that reduces reflection back into the photoresist during its exposure in the lithography step and allows for better pattern reproduction. And, a photoresist layer which is imaged to provide the pattern for transfer to underlying layers.

It would, then, be desirable to have a dry, plasma-based etch process for transfer of the pattern from the developed photoresist through all of the layers within the complete etch stack, including an ARC layer, a conductive layer, and a barrier layer. Etching of a metal-comprising stack is traditionally achieved in a metal etch chamber using etch stacks with ARC layers such as titanium nitride. However, as silicon oxynitride is a dielectric material, its patterning is traditionally reserved for dielectric etch chambers, and moving the substrate from one process chamber to another lowers the productivity of the whole process.

The present invention details a method permitting the etch of a dielectric comprising ARC layer such as a silicon-oxynitride ARC in the same chamber as is used for etching the rest of the metal-comprising stack. We have developed a plasma etch process which provides adequate selectivity for a silicon oxynitride ARC layer over organic-based photoresists. In addition, we have obtained a good etch rate for a silicon oxynitride ARC layer while providing excellent pattern transfer through the ARC layer and other layers of a six layer metal-comprising stack.

SUMMARY OF THE INVENTION

The present invention pertains to a method for plasma etching a semiconductor patterning stack. The patterning stack includes at least one layer comprising either a dielectric-comprising antireflective material or an oxygen-comprising material. In many instances the dielectric-comprising antireflective material will be an oxygen-comprising material, but it need not be limited to such materials. In one preferred embodiment of the method, the chemistry enables the plasma etching of both a layer of the dielectric-comprising antireflective material or oxygen-comprising material and an adjacent or underlying layer of material. In another preferred embodiment of the method, the layer of dielectric-comprising antireflective material or oxygen-comprising material is etched using one chemistry, while the adjacent or underlying layer is etched using another chemistry, but in the same process chamber. Of particular interest is silicon oxynitride, an oxygen-comprising material which functions as an antireflective material.

A preferred embodiment of the method provides for the use of a source of carbon and an appropriate halogen-comprising plasma, to achieve selective etch of one oxygen-containing material compared with another material which contains a more limited amount of oxygen.

In a highly preferred embodiment of the invention, a film of silicon oxynitride is plasma etched, and better selectivity is achieved relative to a film of a lower oxygen content material, such as a photoresist, by using fluorine comprising plasma. Preferably the fluorine comprising plasma also comprises a source of carbon. Example of materials which provide both fluorine and carbon include fluorocarbons such as $CHF_3$, $CF_4$, $CF_3Cl$, $C_2F_4$, $C_2F_6$ and combinations thereof. The fluorocarbons may be combined with other gases which increase the halogen content of the plasma, such as $Cl_2$, $F_2$, HF, HCl, $NF_3$, or $SF_6$, for example, but not by way of limitation. The addition of such other gases is helpful in increasing the etch rate, and in some instances the selectivity, of the silicon oxynitride. When the gas used to increase the halogen content comprises a halogen other than fluorine, such as chlorine, the etch rate of some other stack layer materials such as a $TiN_x$ barrier layer is also increased. The addition of chlorine to a fluorocarbon plasma should enhance etch of such a barrier layer material along with the silicon oxynitride, while the etch of an oxygen-poor material such as a photoresist is suppressed.

We have discovered a preferred combination of plasma etch gases which provides an unexpectedly high etch rate while providing selectivity for silicon oxynitride over patterning photoresist. The preferred combination of plasma etch gases is $CHF_3$ and $Cl_2$, wherein the gas flow ratio of $CHF_3$ to $Cl_2$ ranges between about 2:1 and about 1:3, wherein a ratio of about 2:1 is recommended for high silicon oxynitride to photoresist selectivity, and a higher chlorine content is recommended for etching both the layer of silicon oxynitride and an underlying layer containing a metal or a refractory metal such as titanium nitride. It is expected that the use of $CF_4$ rather than $CHF_3$ would require less $Cl_2$ to selectively etch silicon oxynitride and that $CF_4$ alone might be sufficient. Further, since the silicon etch rate is dependent on fluorine rather than chlorine, the use of $CF_4$ should increase the etch rate of silicon oxynitride and may provide an improvement in selectivity as compared with $CHF_3$.

BRIEF DESCRIPTION OF THE DRAWINGS

FIGS. 3A–3C illustrate the Example Two stack cross-sectional view schematic as the etch stack shown in FIG. 1 progresses through a two step etch process, including one step for etching the silicon oxynitride and titanium nitride layers and a second metal etch step for etching the three layers as described with reference to FIG. 2C.

DETAILED DESCRIPTION OF THE PREFERRED EMBODIMENTS

Figure 1:
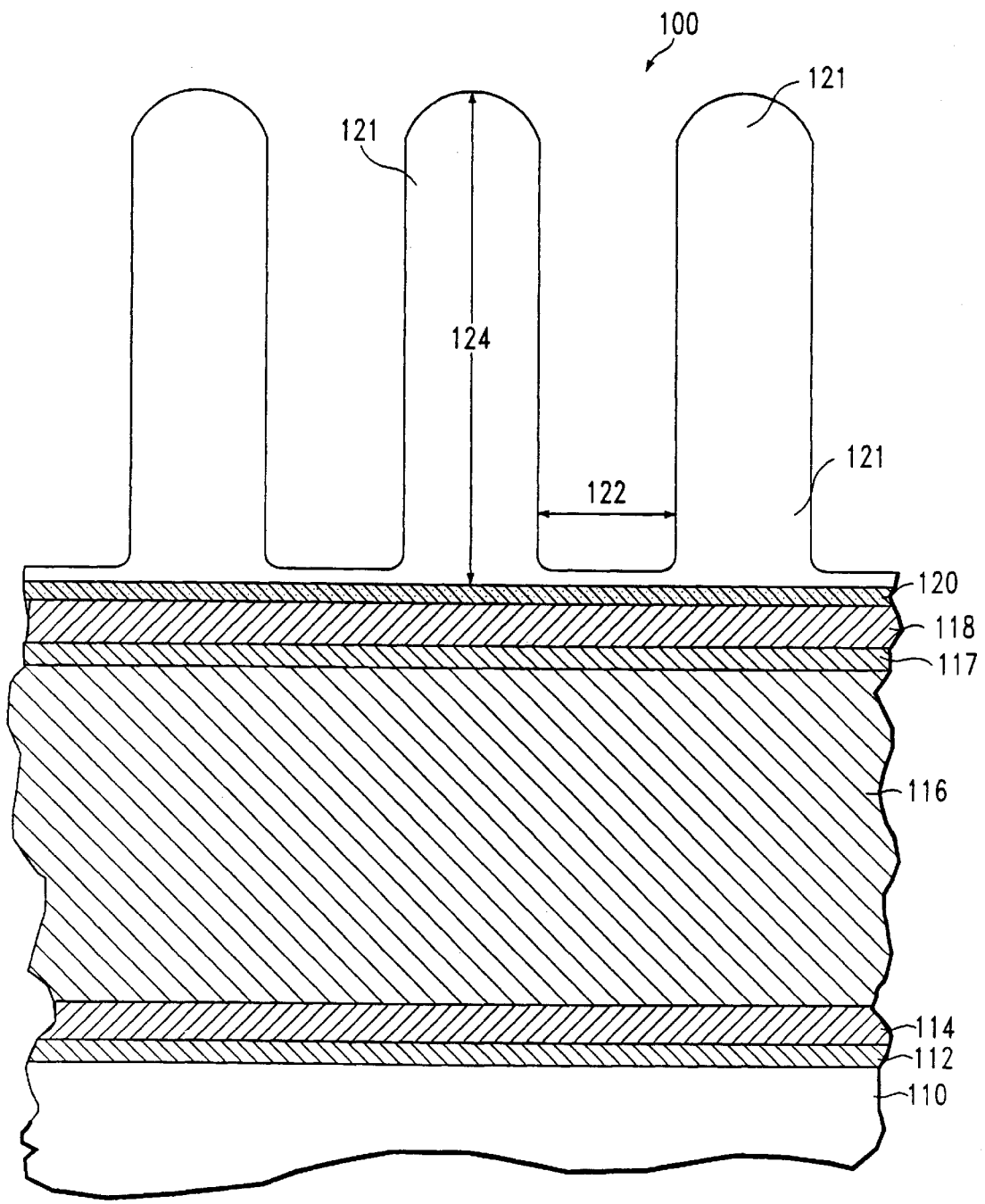
FIG. 1 shows a schematic of the cross-sectional view of the preferred embodiment metal etch stack incorporating silicon oxynitride as the ARC layer.

A method is disclosed for the selective etching of silicon oxynitride and other oxygen-comprising layers on a multi-layered substrate. The method provides for the selective etching of such oxygen-comprising substrates in a halocarbon-comprising etch plasma, and particularly in a fluorocarbon-comprising etch plasma. Finally, an especially preferred embodiment for the selective etching of silicon oxynitride is described.

Polymer films derived from carbon and halogens which are present in an etch plasma have been observed to deposit on the surfaces of silicon and silicon oxide during etch processing, see for example, S. Arai et al., Japanese J. of Appl. Phys., Part 1, V. 31, 2011–2019 (1992).

We wanted to use silicon oxynitride as an anti-reflective coating in a multi-layered etch structure for the plasma etching of an aluminum conductive layer. To etch the silicon oxynitride we used a fluorocarbon-comprising plasma. Although we were not certain that polymer films were depositing on substrate surfaces during the etching of the silicon oxynitride, we suspected this might be the case. During development of the etching process, we discovered that we could adjust the selectivity of the etch for silicon oxynitride compared to the photoresist used to pattern the multi-layered etch structure (stack) by adjusting the atomic ratio of fluorine to carbon in the gases supplied to the process chamber.

It appears that the selectivity of silicon oxynitride etch is improved through the formation of a fluorine-comprising polymer. We believe that while the polymer builds up on the surfaces of non-oxygenated materials, slowing down etching on these surfaces, on the surface of silicon oxynitride, the following reaction takes place:

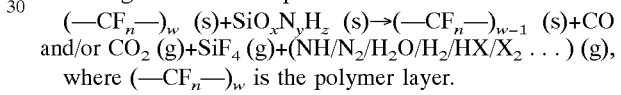

and/or $CO_2$ (g)+$SiF_4$ (g)+($NH/N_2/H_2O/H_2/HX/X_2$ ...) (g), where $(—CF_n—)_w$ is the polymer layer.

This reaction results in consumption of the polymer simultaneously with etching of silicon oxynitride, while producing highly volatile byproducts. These byproducts are later removed as exhaust with the help of a vacuum pump.

To maximize the selectivity of the etch, the proper balance of carbon and fluorine in the plasma is achieved by adjusting the flow rates of gases injected into the etch processing chamber. Such adjustment is usually made by selecting from the following options: Choosing the primary gas feed with a particular carbon to fluorine atomic ratio, where the ratio may be adjusted by selection from gases such as $CHF_3$, $CF_4$, $C_2F_4$, $C_2F_6$ or a combination thereof; adding oxygen or another oxidizing agent which binds with carbon in the plasma to suppress the formation of polymer; and adding a gas which serves as a source of carbon, such as CO, when it is desired to increase the polymer formation. It should be mentioned that if photoresist is present in the etch chamber, its erosion during the plasma etching process produces considerable amounts of carbon, and the composition of the gas feed has to be adjusted in conjunction with the pattern density of the photoresist and possibly with the kind of photoresist.

We have achieved a surprising increase in the etch rate of silicon oxynitride by adding an assisting halogen-comprising gas such as $Cl_2$, $F_2$, HF, HCl, or $SF_6$ (preferably $Cl_2$ and $SF_6$) to the fluorocarbon-comprising plasma feed gases. This list of gases can be extended to include other gases which serve as a source of halogen atoms in the plasma. The benefits of using such an assisting gas are twofold. If etching of silicon oxynitride is carried out in a metal etch chamber, and this is desirable when the silicon oxynitride is used as an ARC layer in a metal stack, such halogen-containing gases are likely to be connected to the etch system for the purpose of metal etch. Also, the addition of a halogen other than fluorine appears to provide additional flexibility in controlling the etch rates of other materials exposed to the plasma. For example, the etching of a titanium nitride barrier layer is better using chlorine than fluorine, and the addition of chlorine to a fluorocarbon-comprising plasma enhances the etching of this material simultaneously with the etching of silicon oxynitride, while the etching of an adjacent photoresist is suppressed due to the presence of polymer or halocarbon species on its surface.

We have discovered a preferred combination of plasma etch gases which provides an unexpectedly high etch rate while providing selectivity for silicon oxynitride over patterning photoresist. The preferred combination of plasma etch gases is $CHF_3$ and $Cl_2$, wherein the gas flow ratio of $CHF_3$ to $Cl_2$ ranges between about 2:1 and about 1:3, wherein a ratio of about 2:1 is recommended for high silicon oxynitride to photoresist selectivity, and a higher chlorine content is recommended for simultaneous etching of silicon oxynitride and a barrier layer such as titanium nitride. It is expected that the use of $CF_4$ rather than $CHF_3$ would require less $Cl_2$ to selectively etch silicon oxynitride and that $CF_4$ alone is likely to be sufficient. Further, since the silicon etch rate is dependent on fluorine rather than chlorine, the use of $CF_4$ should increase the etch rate of silicon oxynitride and may provide an improvement in selectivity as compared with $CHF_3$.

In view of the successful etching of silicon oxynitride, we believe that in a halocarbon-based etch plasma it is possible to improve the selectivity of oxygen-comprising layers over adjacent layers which contain substantially less oxygen or no oxygen, using the method described above and expanded upon below.

In particular, a carbon source and an appropriate halogen-comprising plasma can be used to achieve selective etching of an oxygen-comprising material compared with a material which contains no oxygen or a substantially reduced amount of oxygen. We believe that the following reaction would take place between an oxygen-rich substrate and a polymer film or halocarbon-comprising species on its surface.

$(-CX_n-)_y$ (s)+$RO_m$ (s)→$(-CX_n-)_{y-1}$ (s)+CO and/or $CO_2$ (g)+$wX_k$ (g), where $(-CX_n-)_y$ is the polymer layer or halogen-comprising species; X is a halogen, such as F, Cl, Br, or I; $RO_m$ is an oxygen containing material, such as $SiO_xN_y$, $SiO_2$, or $TiO_xN_y$; $wX_k$ is the halogenated etch byproduct, such as $SiF_4$, $TiF_4$, or $TiCl_4$; and (s) and (g) represent a solid and a gas, respectively.

The overall outcome of this reaction is that part of the polymer (or halocarbon-comprising species) reacts with the substrate material to form gaseous products that can be subsequently removed from the plasma process chamber with the exhaust gases. Thus, an oxygen-comprising material is etched while the etching of a material which does not contain oxygen is hindered. By choosing the appropriate halogen so that the halogenated byproducts $wX_k$ have the highest possible vapor pressure, the best results can be achieved.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to "a conductive material" includes metals such aluminum, copper, platinum, iridium, rubidium, and combinations and alloys thereof, as well as other conductive materials which would be suitable in the application described.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example. Typically such alloys of aluminum comprise about 0.5% copper. In addition, as is known in the art, aluminum typically exhibits a surface layer of aluminum oxide.

The term "antireflective coating", "antireflective layer" or "ARC" includes materials which are applied to a surface to reduce its reflection of electromagnetic radiation.

The term "decoupled plasma source" or "DPS" as used herein refers to a plasma etch apparatus with separate controls for the inductive coupling of RF power which controls plasma density (source power) and the bias power which controls ion bombardment energy of the substrate surface.

The term "dielectric ARC" or "dielectric-comprising ARC" refers to an ARC which comprises a dielectric material.

The term "feature" refers to metal lines, trenches and openings in a dielectric layer, and other structures which make up the topography of the substrate surface. Feature size often refers to the size of the smallest feature on the wafer.

The term "ion bombardment" refers to the collision of ions with a surface. The ions are accelerated toward the surface by electric fields in the vicinity of the surface exposed to a plasma.

The term "plasma" refers to a partially ionized gas containing an approximately equal number of positive and negative charges, as well as some other number of non-ionized gas species.

The term "selectivity" is used to refer to a) a ratio of etch rates of two materials; and b) a condition achieved during etch when etch rate of one material is increased in comparison with another material. Note that there are various kinds of materials included in a stack of layers used in an etching process.

The term "source power" refers to the power that is responsible for sustaining the plasma by providing a major portion of the energy to ionize the neutral species in the chamber.

The term "stack" or "etch stack" refers to a collection of layers of different materials deposited one over the other, at least a portion of which are etched during an etching process. A "metal stack" refers to a "stack" which, upon completion of a metal etch process becomes a metal-comprising feature on a substrate.

The term "substrate" includes semiconductor materials, glass, ceramics, polymeric materials, and other materials of use in the semiconductor industry.

The term "vertical profile" refers to a feature profile wherein a cross-section of the feature exhibits side walls which are perpendicular to the surface on which the feature stands. Alternatively, a "positive profile" is one wherein the width of the cross-section of the feature is larger at the surface on which the feature stands than at a distance away from the surface.

II. An Apparatus for Practicing the Invention

The preferred embodiment etch processes described herein were carried out in a Centura® Integrated Processing System available from Applied Materials, Inc. of Santa Clara, Calif. The system is shown and described in U.S. Pat. No. 5,186,718, the disclosure of which is hereby incorporated by reference. This equipment included a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996). The plasma processing chamber enables the processing of an 8 inch (200 mm) diameter silicon wafer.

Figure 4:
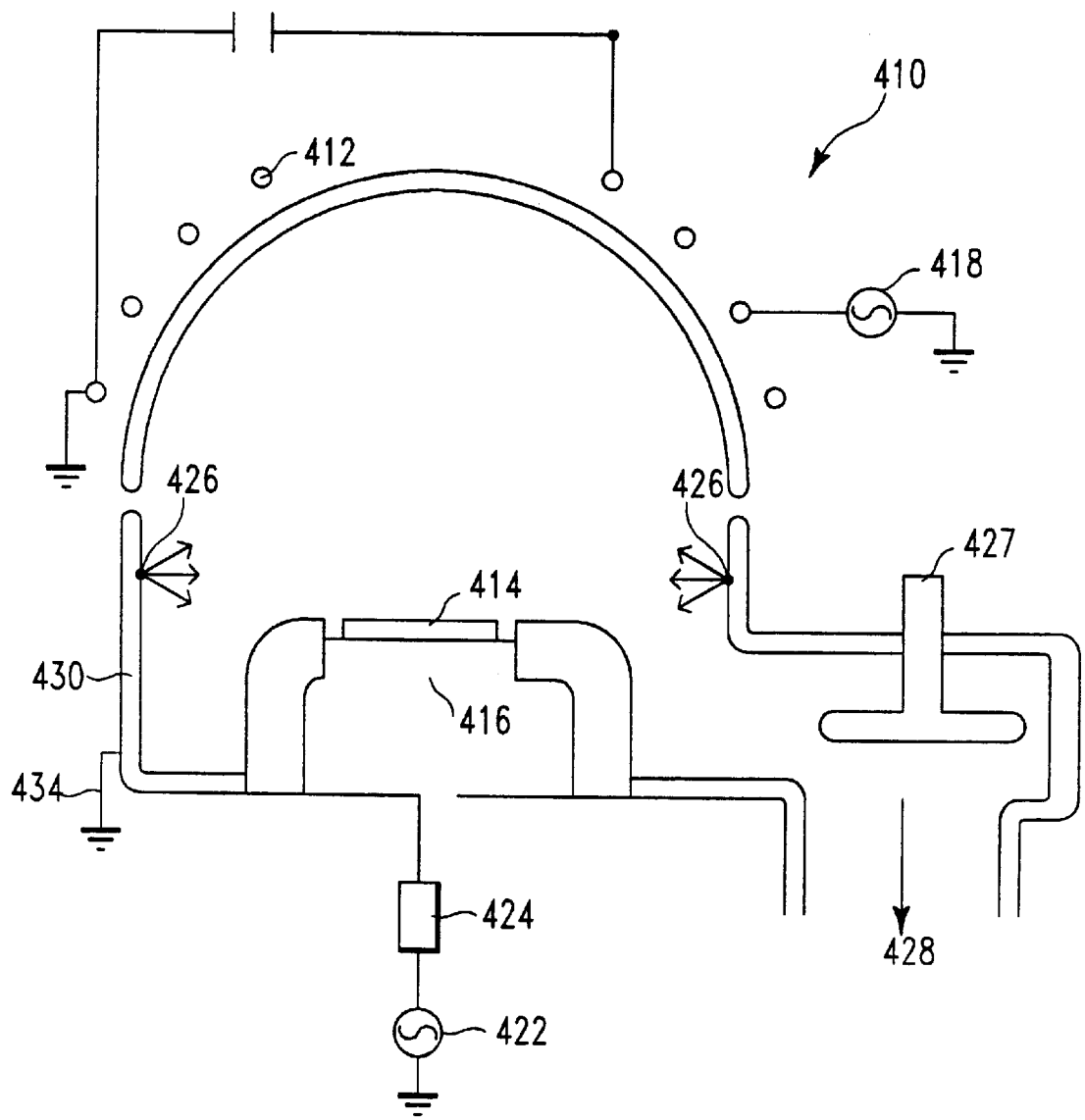
FIG. 4 shows a plasma processing apparatus of the kind used in carrying out the etching processes described herein.

A schematic of the processing chamber is shown in FIG. 4 which shows an etching process chamber 410, which is constructed to include at least one inductive coil antenna segment 412 positioned exterior to the etch process chamber 410 and connected to a radio frequency (RF) power generator 418 (source power generator with a frequency tunable around 2 MHz for impedance matching at different plasma conditions). Interior to the process chamber is a substrate 414 support pedestal (cathode) 416 which is connected to an RF frequency power generator 422 (bias power generator of frequency fixed at 13.56 MHz) through an impedance matching network 424, and a conductive chamber wall 430 which serves as the electrical ground 434.

The semiconductor substrate 414 is placed on the support pedestal 416 and gaseous components are fed into the process chamber through entry ports 426. A plasma is ignited in process chamber 410 by applying RF powers 418 and 422. Pressure interior to the etch process chamber 410 is controlled using a vacuum pump (not shown) and a throttle valve 427 situated between process chamber 410 and the vacuum pump. The temperature on the surface of the etch chamber walls is controlled using liquid-containing conduits (not shown) which are located in the walls of the etch chamber 410. The temperature of the semiconductor substrate is controlled by stabilizing the temperature of the support pedestal and flowing helium gas in the channels formed by the back of the substrate and grooves (not shown) on the pedestal 416 surface. The helium gas is used to facilitate heat transfer between the substrate and the pedestal. During the etch process, the substrate surface is gradually heated by the plasma to a steady state temperature which is approximately 25–40° C. higher than the substrate support platen temperature, depending on the process conditions. It is estimated that the substrate surface temperature was typically around 75° C. during most of our experiments. The surface of the etching chamber 410 walls was maintained at about 80° C. using the cooling conduits previously described.

III. Examples of Etching Silicon Oxynitride

Three sets of experiments were performed. First, the basic effect of etch chemistry was evaluated by etching unpatterned silicon oxynitride and unpatterned I-line photoresist wafers and the etch rates were compared to estimate the selectivity. (The photoresist and silicon oxynitride were not simultaneously present in the plasma.) $CHF_3$, $Cl_2$, $SF_6$, $BCl_3$ and combinations thereof were evaluated in this testing. The etch rates obtained are provided in Table I below. The etch conditions were as follows. The plasma source power was 1400 W; the bias power was 130 W; the process chamber pressure was 13 mTorr; the substrate support platen temperature was 45° C.; the support platen back side helium pressure was 10 Torr, with a typical leak of 3–6 sccm, and etching was carried out for 40 seconds. This experimentation indicated that $CHF_3$ and $Cl_2$ used together provided the most promising combination of selectivity and etch rate.

TABLE I

Unpatterned $SiO_xN_y$ and Photoresist Etch Rates and Selectivity As A Function of Etch Gas Feed Composition

| $Cl_2$ (sccm) | $BCl_3$ (sccm) | $SF_6$ (sccm) | $CHF_3$ (sccm) | $SiO_xN_y$ ER (Å/min) | PR ER (Å/min) | Select |
|---|---|---|---|---|---|---|
| 100 | — | — | — | 1222 | 2820 | 0.443 |
| — | 100 | — | — | 724 | 643 | 1.13 |
| — | — | 100 | — | 2625 | 6048 | 0.434 |
| — | — | — | 50 | 2112 | 1467 | 1.44 |
| 50 | — | — | 50 | 2884 | 2512 | 1.15 |
| — | 50 | — | 50 | 1789 | 1564 | 1.14 |
| — | — | 50 | 50 | 2713 | 4575 | 0.593 | where: ER is etch rate; PR is photoresist; and Select is selectivity.

In the second set of experiments, we pattern etched a silicon oxynitride layer of about 3500 Å in thickness which had been applied over a silicon dioxide surface. The pattern was lines and spaces having a feature size down to about 0.25 μm which was transferred from a patterned layer of DUV photoresist (Shipley UV-5 of about 6500–7000 Å in thickness). The substrate was then examined with a scanning electron microscope to determine the pattern profile and to estimate the etch rates and selectivity. The details are provided in Tables II and III. It was discovered that, due to the increased amount of carbon released into the plasma from the photoresist surface, silicon oxynitride could not be etched in pure $CHF_3$ under the process conditions used (basically the same conditions as described above for the initial experimentation). The etch rate had dropped by a factor of about three in the area of the substrate at a distance away from the photoresist lines (open area) and by a factor of about ten in between the lines, as compared to the etch rate of unpatterned silicon oxynitride. This situation was subsequently amended by adding $Cl_2$ to the plasma gas feed. In particular, the $Cl_2$ added made up from about 33% to about 75% of the total volumetric gas flow.

TABLE II

Process Conditions For The Pattern Etch Of Silicon oxynitride.

| Substrate Number | $CHF_3/Cl_2/BCl_3$ (sccm) | Pressure (mTorr) | Source Power (W) | Bias Power (W) | Support Platen Temp. (° C.) | Time (sec) | Comments |
|---|---|---|---|---|---|---|---|
| 1 | 50/0/0 | 14 | 1400 | 80 | 45 | 60 | Low etch rate |
| 2 | 50/0/0 | 12 | 1400 | 100 | 45 | 180 | Low etch rate |
| 3 | 50/50/0 | 12 | 1400 | 100 | 45 | 120 | Drastic |

TABLE II-continued

Process Conditions For The Pattern Etch Of Silicon oxynitride.

| Substrate Number | CHF$_3$/Cl$_2$/ BCl$_3$ (sccm) | Pressure (mTorr) | Source Power (W) | Bias Power (W) | Support Platen Temp. (° C.) | Time (sec) | Comments |
|---|---|---|---|---|---|---|---|
| 4 | 50/50/0 | 12 | 1400 | 100 | 45 | 60 | Rate Increase Looks Good |
| 5 | 50/25/0 | 12 | 1400 | 100 | 45 | 60 | No Large Change |
| 6 | 50/12/0 | 12 | 1400 | 100 | 45 | 60 | |
| 7 | 50/25/0 | 12 | 1400 | 130 | 45 | 45 | |
| 8 | 50/25/0 | 12 | 1100 | 100 | 45 | 60 | |
| 9 | 50/25/0 | 15 | 1400 | 100 | 45 | 45 | |
| 10 | 40/20/0 | 12 | 1400 | 100 | 45 | 60 | |
| 11 | 50/25/0 | 12 | 1400 | 100 | 30 | 60 | Positive Profile |
| 12 | 20/20/0 | 12 | 1400 | 100 | 45 | 60 | Slt. Pos. Profile |
| 13 | 20/60/0 | 12 | 1400 | 100 | 45 | 60 | |
| 14 | 20/0/60 | 12 | 1400 | 100 | 45 | 60 | Vry. Pos. Profile |

A positive profile is one in which a line is wider at the bottom than at the top, so that the included angle at the base of the line is greater than the desired 90°. Helium backside pressure was 10 Torr throughout all trial runs.

TABLE III

Etch Rate And Selectivity Of Pattern Etching Silicon oxynitride (Substrate numbers correspond with the ones given in Table II)

| SUBSTRATE NUMBER | PROCESS CHANGE | ETCH RATE* SiO$_x$N$_y$ (Å/MIN) | PR LOSS TOP SHOULDER (Å/MIN) | SELECTIVITY** (OPEN/TOP) |
|---|---|---|---|---|
| 5 | BASE-LINE | 3100 | 2500 | 3100 | 1.2 ± 0.1 |
| 6 | –CL$_2$ | 2600 | 2300 | 2900 | 1.1 ± 0.1 |
| 7 | +BIAS | 3450 | 3300 | 4200 | 1.0 ± 0.1 |
| 8 | –SOURCE | 2900 | 2900 | 3500 | 1.0 ± 0.1 |
| 9 | +PRESSURE | 2900 | 2700 | 3400 | 1.1 ± 0.1 |
| 1o | –FLOW | 2800 | 2800 | 3200 | 1.0 ± 0.1 |
| 11 | –TEMP | 2800 | 2400 | 3000 | 1.2 ± 0.1 |
| 12 | –FLOW | 1700 | 2500 | 3400 | 0.68 ± 0.08 |
| 13 | –CHF$_3$ + CL$_2$ | 2100 | 3300 | 3800 | 0.64 ± 0.08 |
| 14 | CHF$_3$ + BCL$_3$ | 1300 | 2000 | 3100 | 0.65 ± 0.0 |

*Etch rate in the open area.
**Ratio of the open area etch rate to the photoresist loss rate at the top in a 0.25 μm / 0.25 μm (line/space) line array.

In the third set of experiments, a full metal stack upon a silicon wafer substrate, which included an aluminum metal layer and titanium nitride barrier layers was etched. The profiles were examined with the help of a scanning electron microscope. The details for the third set of experiments are given in the EXAMPLES provided below.

FIG. 1 illustrates a typical preferred embodiment etch stack 100 for patterning an aluminum conductive layer to feature sizes down to 0.25 μm or less using a DUV photoresist as a patterning means. In particular, the substrate 110 is a layer of silicon dioxide overlying a silicon wafer surface (not shown). The barrier layer is a bilayer composed of a 300 Å thick layer of titanium 112, followed by a 500 Å thick layer of titanium nitride 114. Overlying titanium nitride barrier layer 114 is a 5,200 Å thick layer 116 of aluminum alloy containing 0.5% copper. Overlying aluminum alloy layer 116 is a second 300 Å thick layer of titanium 117, followed by a 500 Å thick layer of titanium nitride 118. Overlying second titanium nitride layer 118 is a layer of silicon oxynitride 120 about 300 Å thick. Overlying silicon oxynitride layer 120 is a layer of patterned DUV photoresist 121, where the pattern is lines and spaces and where the lines and spaces have a varying width 122 of about 0.2 μm and larger, and have a height and a height 124 of about 0.7 μm (7,000 Å). In the preferred embodiments described herein, the DUV photoresist was UV-5, manufactured by Shipley Company of Marlborough, Mass. We also evaluated a DUV photoresist manufactured by Shin-Esta of Japan, which performed in a similar manner.

EXAMPLE ONE

This Example is for a three step etch in which the SiO$_x$N$_y$ ARC layer is etched in Step 1, the underlying TiN and Ti barrier layers are etched in Step 2, with the aluminum alloy layer, and underlying TiN and Ti barrier layers being etched in Step 3. With reference to FIGS. 2A through 2D, FIG. 2A illustrates the schematic cross-sectional profile of the preferred embodiment stack 200 (the same stack as 100 described with reference to FIG. 1) during the three etching steps.

Figure 2A:
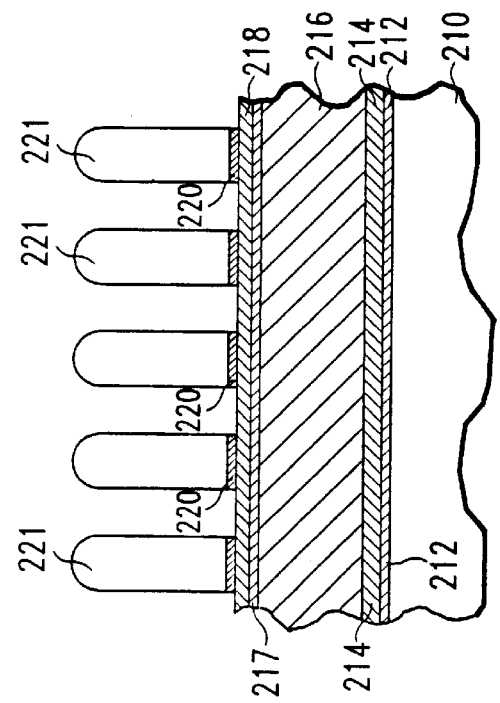
FIGS. 2A–2D illustrate the Example One stack cross-sectional view schematic as the etch stack shown in FIG. 1 progresses through a three step etch process.
Figure 2B:
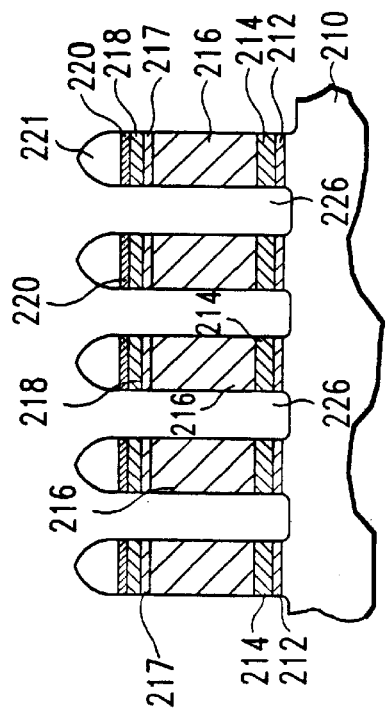

FIG. 2B shows the schematic of the cross-sectional profile of the etch stack after the first etch step in which the pattern is transferred from DUV photoresist layer 221 through silicon oxynitride layer 220, stopping at the upper surface of second titanium nitride layer 218. The etch conditions used to carry out this first etch step were as follows. The source power was 1400 W; the bias power was 100 W; the process chamber pressure was 12 mTorr; the substrate support platen temperature was about 45° C.; the gas flow rates were 50 sccm of CHF$_3$/25 sccm of Cl$_2$, and the wafer back side helium pressure was 12 Torr, with a typical leak of 3–6 sccm. The etch time period was 5 seconds.

Figure 2C:
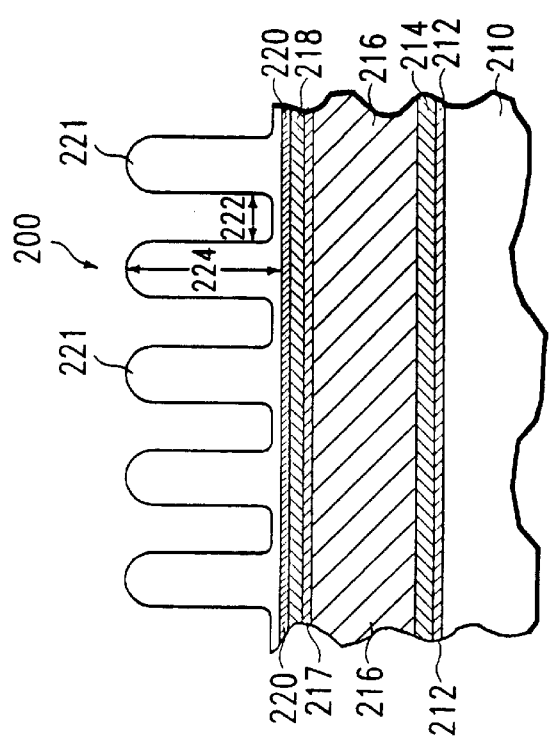

FIG. 2C shows the schematic of the cross-sectional profile of the etch stack after the second etch step in which the pattern is transferred through the second titanium nitride layer 218 underlying silicon oxynitride layer 220, stopping at the upper surface of aluminum layer 216. The etch conditions used to carry out this second etch step were the same as in the first step except that the bias power was 50 W, and the gas flow rates were 15 sccm of CHF$_3$/90 sccm of Cl$_2$. The etch time period was 12 seconds.

Figure 2D:
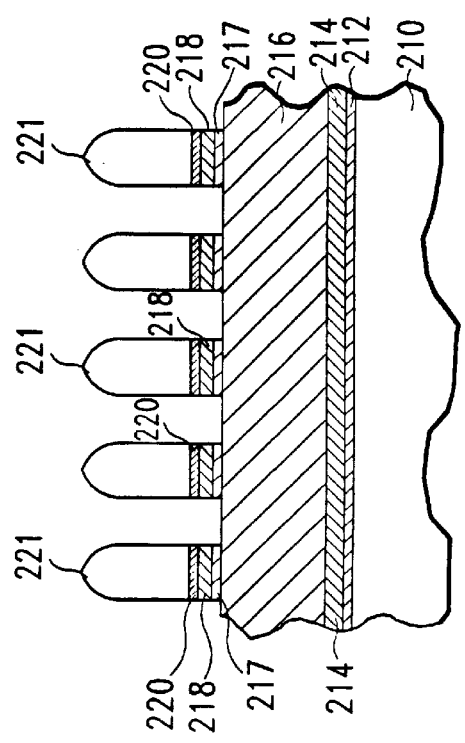

FIG. 2D shows the schematic of the cross-sectional profile of the stack after the third etch step in which the pattern is transferred through the aluminum layer 216, the first titanium nitride barrier layer 214, and the first titanium barrier layer 212, stopping with a slight over etch 226 into the top of silicon dioxide layer 210. The etch conditions used to carry out this second etch step were as follows. The plasma source power was 1100 W; the bias power was 130 W; the process chamber pressure was 8 mTorr; the substrate support platen temperature was 45° C., the gas flow rates were 5 sccm of $CHF_3$/80 sccm of $Cl_2$/40 sccm of $BCl_3$, and the wafer back side helium pressure was 12 Torr, with a typical leak of 3–6 sccm. The etch was carried out for as long as the end point signal at 396 nm (aluminum and titanium lines) was above the background level plus another 10 seconds.

EXAMPLE TWO

This Example is for a two step etch in which the $SiO_xN_y$ ARC layer and the underlying titanium nitride and titanium barrier layers, are etched in Step 1; and, the aluminum layer, and titanium nitride and titanium layers which underlie the aluminum layer are etched in Step 2. With reference to FIGS. 3A through 3C, FIG. 3A illustrates the schematic cross-sectional profile of the preferred embodiment stack 300 (the same stack as 100 described with reference to FIG. 1) for the two etch steps.

FIG. 3B shows the schematic of the cross-sectional profile of the etch stack after the first etch step in which the pattern is transferred from DUV photoresist layer 321 through silicon oxynitride layer 320, second titanium nitride barrier layer 318, and second titanium layer 317, stopping at the upper surface of aluminum layer 316. The etch conditions used to carry out this first etch step were as follows. The source power was 1400 W; the bias power was 70 W; the process chamber pressure was 12 mTorr; the substrate support platen temperature was 45° C., the gas flow rates were 20 sccm of $CHF_3$/60 sccm of $Cl_2$, and the wafer back side helium pressure was 12 Torr, with a typical leak of about 3–6 sccm. The etch time period was 20 seconds. The increased concentration of chlorine, as compared with Example 1, sacrifices the selectivity of silicon oxynitride etch, thus allowing etching of other materials such as titanium nitride. Considering the small thickness of the silicon oxynitride layer, the overall loss of photoresist thickness is negligible and is well justified by the simplification in the etch process.

FIG. 3C shows the schematic of the cross-sectional profile of the stack after the second etch step in which the pattern is transferred through aluminum layer 316, first titanium nitride layer 314 and first titanium layer 312, stopping with a slight over etch 326 into silicon dioxide layer 310. The etch conditions used to carry out this second etch step were as follows. The plasma source power was 1000 W; the bias power was 130 W; the process chamber pressure was 8 mTorr; the substrate support platen temperature was 45° C., the gas volumetric flow rates were 5 sccm of $CHF_3$/80 sccm of $Cl_2$/40 sccm of $BCl_3$, and the wafer back side helium pressure was 12 Torr, with a typical leak of 3–6 sccm. The etch was carried out for as long as the end point signal at 396 nm (aluminum and titanium lines) was above the background level plus another 10 seconds.

The above described preferred embodiments are not intended to limit the scope of the present invention, as one skilled in the art can, in view of the present disclosure expand such embodiments to correspond with the subject matter of the invention claimed below.

We claim:

1. A method for improving selectivity in plasma etching of a semiconductor film stack including at least one oxygen-comprising layer, said method comprising: using an etchant gas including at least one compound comprising fluorine and carbon, wherein the ratio of fluorine to carbon in said etchant gas is adjusted to provide selectivity of etching among materials in said film stack on the basis of the relative oxygen content of said materials.

2. The method of claim 1, wherein said etchant gas forms a fluorine-comprising polymer or species which deposits on exposed surfaces within said film stack in an amount which is proportional to the oxygen content present on said surfaces, whereby the etch rate of said surfaces containing a lower atomic percentage of oxygen is lower than the etch rate of surfaces containing a higher atomic percentage of oxygen.

3. The method of claim 1 or claim 2, wherein said at least one oxygen-comprising layer is silicon oxynitride.

4. The method of claim 3, wherein said silicon oxynitride is $SiO_xN_yH_z$, where x ranges from 0 to about 2, y ranges from about 0 to about 1, and z ranges from 0 to about 1.

5. The method of claim 4, wherein x, y, and z range between about 0.2 and about 0.5.

6. The method of claim 3, wherein an exposed surface adjacent said silicon oxynitride comprises a photoresist.

7. The method of claim 6, wherein said photoresist is a DUV photoresist.

8. The method of claim 1, or claim 2, wherein said plasma etching is carried out in an apparatus which enables independent control of a plasma density and of a source of bias power which affects an ion bombardment energy of a substrate surface.

9. The method of claim 3, wherein said plasma etching is carried out in an apparatus which enables independent control of a plasma density and of a source of bias power which affects an ion bombardment energy of a substrate surface.

10. The method of claim 8, wherein plasma-generated ions are directed toward a surface of said oxygen-comprising layer in a manner which activates oxygen contained on said layer surface to react with carbon adjacent to or in contact with said surface.

11. The method of claim 2, wherein said etchant gas includes an assisting gas which is used to increase an etching rate by controlling the rate of deposition of said fluorine-comprising polymer or species on said stack surface.

12. The method of claim 11, wherein said assisting gas is selected from the group consisting of $Cl_2$, $F_2$, HF, HCl, $NF_3$, $SF_6$, and combinations thereof.

13. The method of claim 11, wherein said etchant gas compound comprising fluorine and carbon is selected from the group consisting of $CHF_3$, $CF_4$, $CF_3Cl$, $C_2F_4$, $C_2F_6$, and combinations thereof.

14. The method of claim 13, wherein said compound is $CHF_3$, $CF_4$, or a combination thereof.

15. The method of claim 13, wherein said assisting gas is selected from the group consisting of $Cl_2$, $F_2$, HF, HCl, $NF_3$, $SF_6$, and combinations thereof.

16. The method of claim 15, wherein said assisting gas is chlorine, and wherein an atomic ratio of fluorine to chlorine in said etchant gas ranges between about 3:1 and about 1:2.

17. The method of claim 1 or claim 2, wherein said oxygen-comprising layer and a metal-comprising layer are both etched using a single etchant gas mixture.

18. The method of claim 1 or claim 2, wherein said oxygen-comprising layer and said metal-comprising layer are both etched in a single processing chamber.

19. The method of claim 2, wherein said etchant gas mixture does not contain free oxygen.

20. A method for plasma etching a silicon oxynitride-comprising layer in a semiconductor film stack, said method comprising: using an etchant gas mixture comprising chlorine and at least one compound comprising fluorine and carbon, wherein the atomic ratio of fluorine to chlorine in said etchant gas ranges between about 3:1 and about 1:2.

21. The method of claim 20, wherein said etchant gas forms a fluorine-comprising polymer or species which deposits on exposed surfaces adjacent to said silicon oxynitride-comprising layer in an amount sufficient to reduce the etch rate of said adjacent material while permitting the etching of said silicon oxynitride-comprising layer.

22. The method of claim 21, wherein a material having an exposed surface adjacent said silicon oxynitride-comprising layer comprises a photoresist.

23. The method of claim 22, wherein said photoresist is a DUV photoresist.

24. The method of claim 21, or claim 22, or claim 23, wherein said plasma etching is carried out in an apparatus which enables independent control of a plasma density and of a source of bias power which affects an ion bombardment energy of a substrate surface.

25. The method of claim 20, wherein said etchant gas compound comprising fluorine and carbon is selected from the group consisting of $CHF_3$, $CF_4$, $CF_3Cl$, $C_2F_4$, $C_2F_6$, and combinations thereof.

26. The method of claim 25, wherein said etchant gas includes an assisting gas which is used to increase the rate of etching by controlling the rate of deposition of said fluorine-comprising polymer or species on said stack surface, wherein said assisting gas is selected from the group consisting of $F_2$, HF, HCl, $NF_3$, $SF_6$, and combinations thereof.

27. The method of claim 20 or claim 21, wherein said oxygen-comprising layer and a metal-comprising layer are both etched using a single etchant gas mixture.

28. The method of claim 20 or claim 21, wherein said oxygen-comprising layer and said metal-comprising layer are both etched in a single processing chamber.

29. The method of claim 21, wherein said etchant gas mixture does not contain free oxygen.

* * * * *